US009369066B2

(12) United States Patent
Johansen et al.

(10) Patent No.: US 9,369,066 B2
(45) Date of Patent: Jun. 14, 2016

(54) MEMS DEVICE COMPRISING AN UNDER BUMP METALLIZATION

(75) Inventors: Leif Steen Johansen, Brönshöj (DK); Jan Tue Ravnkilde, Hedehusene (DK)

(73) Assignee: EPCOS AG, Munich (DE)

( * ) Notice: Subject to any disclaimer, the term of this patent is extended or adjusted under 35 U.S.C. 154(b) by 149 days.

(21) Appl. No.: 13/983,947

(22) PCT Filed: Feb. 10, 2011

(86) PCT No.: PCT/EP2011/051977
§ 371 (c)(1),
(2), (4) Date: Oct. 28, 2013

(87) PCT Pub. No.: WO2012/107094
PCT Pub. Date: Aug. 16, 2012

(65) Prior Publication Data
US 2014/0035434 A1    Feb. 6, 2014

(51) Int. Cl.
*H01L 29/40*      (2006.01)
*H02N 1/00*       (2006.01)
*B81B 7/00*       (2006.01)

(52) U.S. Cl.
CPC *H02N 1/00* (2013.01); *B81B 7/007* (2013.01); *B81B 2201/0257* (2013.01); *B81C 2203/019* (2013.01)

(58) Field of Classification Search
CPC ........... H01L 2224/32225; H01L 2224/05552; H01L 2224/0401; H01L 2224/05541; H01L 2224/0601; H01L 2224/13005; H01L 2224/1401; H01L 2224/05012; H01L 2224/06051; H01L 2224/13012; H01L 2924/1461; H01L 24/13; H01L 24/05; H01L 23/525; H01R 1/04; H01R 1/06; H04R 19/005; H04R 19/04; H04R 2201/003; H04R 2410/03; H04R 2499/11; H04R 31/003; B81B 2201/0257; B81B 7/007
See application file for complete search history.

(56) References Cited

U.S. PATENT DOCUMENTS

| 6,404,064 B1 | 6/2002 | Tsai et al. ............. 257/779 |
| 7,442,040 B2 | 10/2008 | Kuo |
| 7,600,999 B2 | 10/2009 | Knopp |

(Continued)

FOREIGN PATENT DOCUMENTS

| CN | 1392607 | 1/2003 | |
| EP | 1 413 242 A2 | 6/2004 | ............. B81B 7/00 |

(Continued)

OTHER PUBLICATIONS

International Preliminary Report for Patentability for International Application Serial No. PCT/EP2011/051977 mailed on Aug. 22, 2013 (8 pages).

(Continued)

*Primary Examiner* — Chuong A Luu
*Assistant Examiner* — Cory Eskridge
(74) *Attorney, Agent, or Firm* — Nixon Peabody LLP; Rahul Arora

(57) ABSTRACT

The present invention concerns a MEMS device comprising an under bump metallization (4)—UBM—to contact the device via flip-chip bonding with a substrate. The UBM (4) is placed on the surface of the MEMS device and close to the corners of the surface. Further, the shape of the UBM (4) is adapted to the shape of the corners.

22 Claims, 2 Drawing Sheets

(56) References Cited

U.S. PATENT DOCUMENTS

| | | |
|---|---|---|
| 7,658,610 B2 | 2/2010 | Knopp |
| 2004/0166662 A1 | 8/2004 | Lei ................................. 438/614 |
| 2004/0232533 A1 | 11/2004 | Hatakeyama .................... 257/68 |
| 2005/0183950 A1 | 8/2005 | Yamaguchi |
| 2007/0048905 A1 | 3/2007 | Marion ........................... 438/127 |
| 2007/0164445 A1 | 7/2007 | Ejima ............................ 257/777 |
| 2008/0176189 A1 | 7/2008 | Stonisch |
| 2009/0065933 A1 | 3/2009 | Takehara et al. ............... 257/737 |
| 2009/0169035 A1* | 7/2009 | Rombach et al. .............. 381/175 |
| 2010/0159412 A1 | 6/2010 | Moss et al. |
| 2010/0159413 A1 | 6/2010 | Kuo |
| 2010/0276766 A1 | 11/2010 | Tang et al. .................... 257/419 |
| 2011/0317863 A1* | 12/2011 | Inoda et al. .................... 381/369 |

FOREIGN PATENT DOCUMENTS

| | | | |
|---|---|---|---|
| EP | 1 431 242 A2 | 6/2004 | ................ B81B 7/00 |
| JP | 2004-349390 | 12/2004 | |
| JP | 2004-3493990 | 12/2004 | |
| JP | 2005-238540 | 9/2005 | |
| JP | 2007-86517 | 4/2007 | |
| JP | 2009506565 | 2/2009 | |
| JP | 2009-64989 | 3/2009 | |

OTHER PUBLICATIONS

Search Report for International Application Serial No. PCT/EP2011/051977 mailed on Oct. 17, 2011 (3 pages).

\* cited by examiner

- Prior art -

MEMS DEVICE COMPRISING AN UNDER BUMP METALLIZATION

CROSS REFERENCE TO RELATED APPLICATIONS

This application is a U.S. national stage of International Application No. PCT/EP2011/051977, titled "MEMS Device Comprising An Under Bump Metallization" and filed Feb. 10, 2011, which is incorporated herein by reference in its entirety.

The present invention concerns a MEMS device that comprises an under bump metallization (UBM). The UBM is used to contact the device via flip-chip bonding with a substrate.

In flip-chip bonding, a MEMS device is contacted to a substrate via solder bumps. The UBM is the top metal layer on the MEMS device which forms mechanically and electrically stable bonds with the solder bump.

Standard UBM for flip-chip bonding are circular in area. Due to dicing restrains on bump placement, these UBM significantly reduce the active area which can be used for the MEMS device. Due to the usually fragile structure of MEMS devices it is advantageous to use laser dicing for the separation of such devices from a wafer where they have been produced. However, the optical properties of the laser beam require a rather larger clearance of metal around the dicing lane. Roughly, a metal clearance of 40% of the silicon wafer thickness between the UBM pads of two adjacent MEMS devices is required. Accordingly, a clearance of roughly 20% of the silicon wafer thickness is required between an UBM pad and the edge of a MEMS device.

If the MEMS device is a microphone, a membrane is typically placed on the surface of the device. The membrane is placed directly above a back plate wherein the membrane and the back plate are the two electrodes of a capacitor. As much surface area as possible should be reserved for the membrane in order to improve the performance of the MEMS microphone. However, a certain area is required for the UBM to obtain a mechanically stable and reliable bond.

It is an object of the present invention to provide a MEMS device having an UBM that allows a more efficient use of the surface space of a MEMS device.

A MEMS device according to claim 1 provides a solution for this object. The dependent claims disclose advantageous embodiments of the present invention.

A MEMS device according to the present invention comprises an UBM to contact the device via flip-chip bonding with a substrate. The UBM is placed on the surface of the MEMS device and close to the corners of the surface. The shape of the UBM is adapted to the shape of the corners. Thereby, no surface space is wasted.

A shape adapted to the corner is understood to be a shape different from a circle. Most preferred are shapes having two edges following a tangent of the circle that runs parallel to the edges of the surface forming the corner. But all shapes that cover an amount of area of the surface between a virtual circular UBM and the most preferred shape as defined above are allowed. Thereby the center of the adapted UBM is shifted nearer to the corner and some surface area adjoining the UBM most distant from the corner is saved without diminishing the UBM area with regard to a reference UBM of circular shape.

Due to the usually fragile structure of MEMS devices it is advantageous to use laser dicing for the separation of such devices from a wafer where they have been produced. However, the optical properties of the laser beam require a rather larger clearance of metal around the dicing lane. This clearance defines a minimum distance between the UBM and the dicing lane. However, adapting the shape of the UBM to the shape of the corners of a device is advantageous also for the use of other dicing methods.

The surface of the MEMS device can comprise an active area. The shape of the UBM can further be adapted not only to the shape of the corners, but also to the shape of the active area. In one embodiment, the active area comprises a membrane placed on the surface of a MEMS microphone and directly above a counter electrode.

Usually the surface of MEMS devices is rectangularly shaped as they are separated from wafers. Accordingly, the UBM is approximately triangularly shaped in order to fit into the corners of a rectangular surface. Specific embodiments of an approximately triangularly shaped UBM are UBMs with a shape of a triangular with rounded corners or UBM with the shape of an isosceles triangle.

Preferably, one side of the UBM is concave if further elements are placed on the surface of the device. An UBM with one concave side leaves more space in the middle of the device for the further elements. The UBM can follow the shape of the active part of the MEMS device with the minimum allowed design distance.

An UBM is provided on the surface of a MEMS device in order to allow contacting the MEMS device via flip-chip bonding to a substrate. Usually, another metal layer and/or a conducting layer is placed below the UBM. The conducting layer can comprise highly doped polysilicon layers. The term "UBM pad" refers to all metal layers, i.e. the UBM and underlying metal layers, plus other conducting layers. All layers of the UBM pad can obstruct a laser beam during dicing if arranged too close to the dicing line. Therefore, the same limitation as for the UBM are also valid for the UBM pad. In particular, a clearance of roughly 20% of the silicon wafer thickness is required between the UBM pad and the edge of the MEMS device.

The UBM pad can have the same shape as the UBM or can overlap the UBM.

The UBM pad is typically placed on the substrate close to the corners of the MEMS device. Preferably, the shape of the UBM pad is adapted to the shape of the corners of the device. Further, the shape of the UBM pad can be adapted not only to the shape of the corners and but also to the shape of the active area. Accordingly, the UBM pad can be approximately triangularly shaped and/or can comprise one concave side.

The MEMS device can comprise four UBM and respectively four UBM pads and one of these UBM or UBM pads each is placed in each corner of the device. Each of these UBMs can be adapted to the respective corner. However, MEMS devices with other numbers of UBMs are possible as well.

The invention will be further described with reference to the accompanying drawings.

Figure 1:
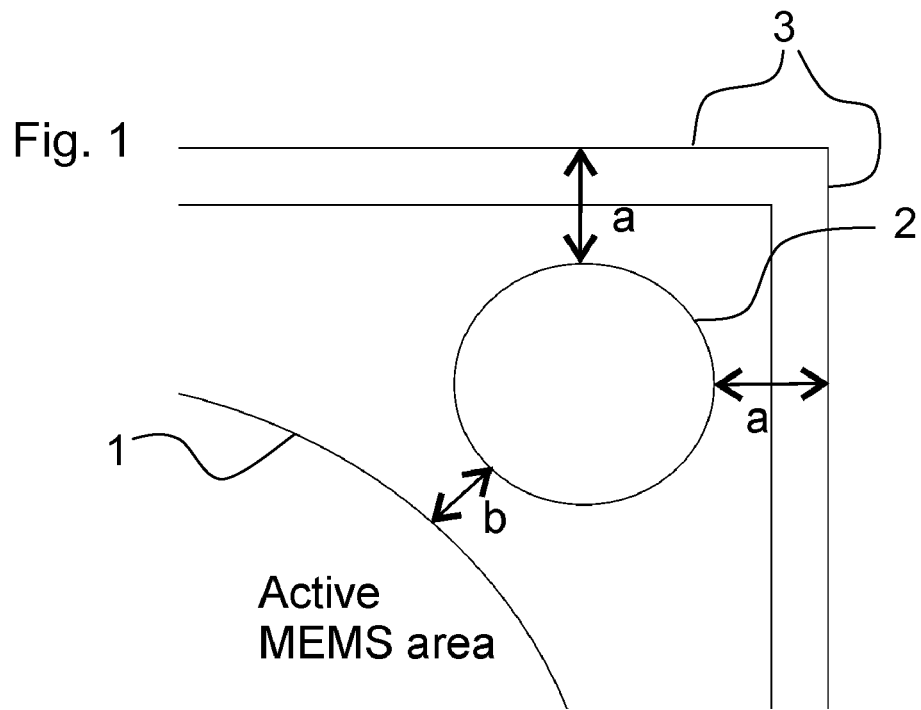
FIG. 1 shows a section of a MEMS microphone wherein a circular UBM is placed in the corner, as known in the prior art.

FIG. 1 shows a section of a MEMS microphone as known in the prior art. The surface of the MEMS microphone comprises an active part 1 and a circular UBM 2. The active part comprises a membrane. The membrane is placed directly above a back plate. The back plate and the membrane are two electrodes and form a capacitor. By monitoring the capacitance of the capacitor, the device detects acoustic waves and can be used as a microphone. Furthermore, the active part 1 can comprise further elements that are not shown in FIG. 1.

Due to dicing restrains, the UBM 2 needs to have a minimum distance a to the edges 3 of the surface. Further, the UBM 2 needs to have a minimum distance b to the active part 1.

Due to its circular shape, the UBM 2 takes up a relatively large area of the MEMS microphone die. As the shape of the circular UBM 2 is not adjusted to the shape of the active part 1 or the shape of the corners, a lot of surface space is wasted and has to be left empty.

Figure 2:
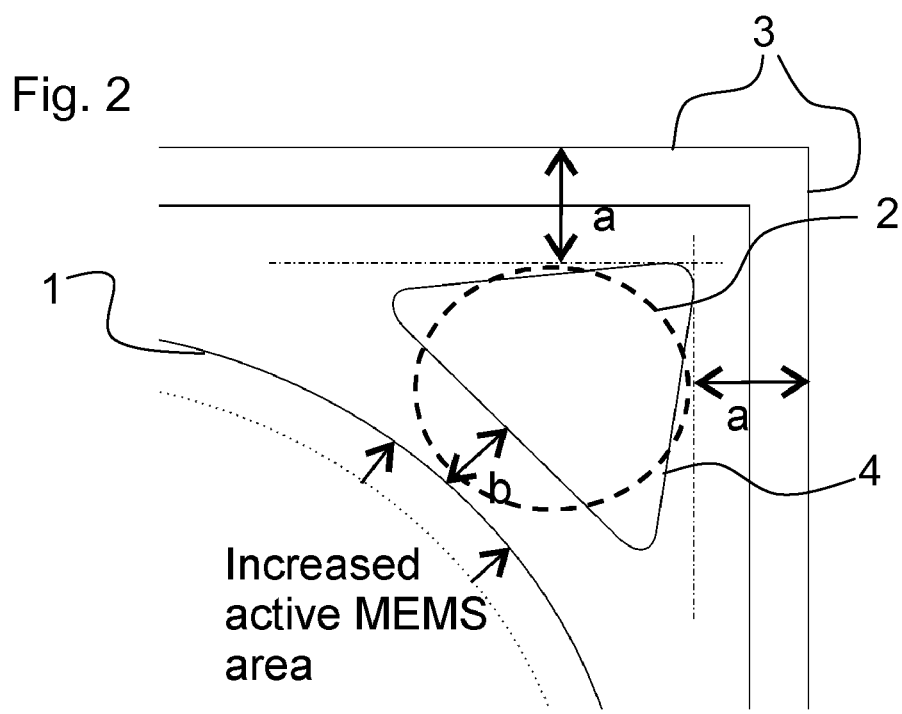
FIG. 2 shows a section of a MEMS microphone comprising an UBM according to the present invention.

FIG. 2 shows a section of a surface of a MEMS microphone, wherein the UBM 4 has a shape that is adjusted to the corners and to the shape of the active part 1. Accordingly, the UBM 4 is approximately triangular. The virtual circular area of a known UBM 2 is depicted for reference only as a dotted line. It can be seen from FIG. 2 that the size of the active part 1 can be increased while still providing a minimum distance b between the active part 1 and the UBM 4 and a minimum distance a between the UBM 4 and the edges 3 adjoining the corner.

The MEMS microphone is made of a die. The shape of the UBM 4 is adjusted to the shape of the die. Typically, a die is rectangularly shaped. Accordingly, the UBM 4 can be triangularly shaped so that it is adjusted to the corners of the die.

The UBM 4 as shown in FIG. 2 takes up the same area as the virtual circular UBM 2 being the same as the UBM 2 as shown in FIG. 1 or can even be larger. Accordingly, the bonding is as stable as for a circular UBM 2.

Figure 3:
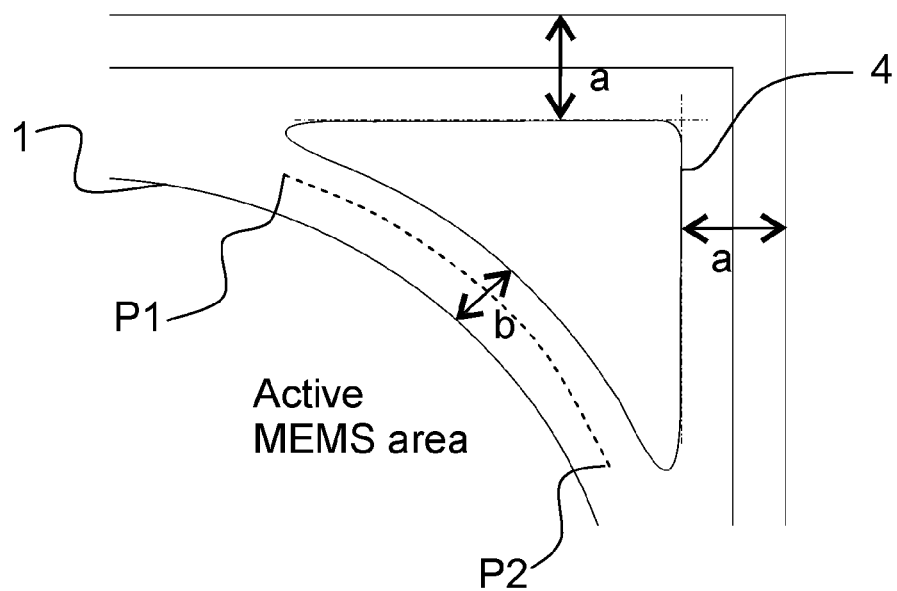
FIG. 3 shows a section of a MEMS microphone comprising an UBM according a second embodiment of the present invention.

Further, FIG. 3 shows the second embodiment of the UBM 4. Here, the UBM 4 has a shape that is not only adjusted to the corners but further adjusted to the shape of the active part 1. Accordingly, the shape of the UBM 4 is concave so that the active part 1 and the UBM 4 are almost parallel to each other and have a constant distance of b along the dotted line between the points P1 and P2. Between P1 and P2, the UBM 4 follows the shape of the active part 1 of the MEMS device with the minimum allowed design distance b.

The other layers of the UBM pad are not shown in FIGS. 1 to 3. In general, an UBM pad comprises an UBM 2, 4, at least one underlying metal layer and/or at least one conducting layer. The UBM pad can have the same shape as the UBM 2, 4 or can overlap the UBM 2, 4.

An UBM 4 or respectively an UBM pad according to the present invention allows to use more active surface area for the MEMS microphone while providing a stable bonding to a substrate. Therefore, an UBM 4 or respectively an UBM pad according to the present invention yields a better electro acoustical performance of the microphone.

The invention claimed is:

1. A MEMS device, comprising:
a surface having an under-bump metallization (UBM) to contact the MEMS device with a substrate via flip-chip bonding, the surface having a corner;
an active part on the surface; and
wherein the UBM is placed on the surface of the MEMS device at a location that is close to the corner of the surface, the UBM including an inner edge that follows the shape of the active part at a constant distance from the active part, and
wherein a shape of the UBM is adapted to the shape of the corner and the shape of the active part.

2. The MEMS device according to claim 1, wherein the shape of the UBM is approximately triangular.

3. The MEMS device according to claim 2, wherein the triangular shape includes rounded corners.

4. The MEMS device according to claim 2, wherein the triangular shape is that of an isosceles triangle.

5. The MEMS device according to claim 2, wherein one side of the UBM is concave.

6. The MEMS device according to claim 1, wherein the device comprises four UBMs, one of the four UBMs is placed in a corresponding one of the corners of the surface of the device.

7. The MEMS device according to claim 1, wherein the MEMS device is a MEMS microphone chip.

8. The MEMS device according to claim 1, wherein the UBM is part of a UBM pad located on the surface, the UBM pad further comprising at least one of an underlying metal layer and a conducting layer below the UBM, wherein the UBM pad is placed close to the corners of the MEMS device, and wherein the shape of the UBM pad is adapted to the shape of the corners.

9. The MEMS device according to claim 8, wherein the conducting layer comprises highly doped polysilicon.

10. The MEMS device according to claim 8, wherein the UBM pad is approximately triangularly shaped.

11. The MEMS device according to claim 10, wherein one side of the UBM pad is concave.

12. The MEMS device according to claim 8, wherein the device comprises four UBM pads and one of the UBM pads is placed in each corner of the device.

13. The MEMS device according to claim 1, wherein the device comprises four UBMs, one of the four UBMs is placed in a corresponding one of the corners of the surface of the device, the shape of each of the four UBMs is approximately triangular with rounded corners.

14. The MEMS device according to claim 13, wherein the MEMS device is a MEMS microphone chip.

15. The MEMS device according to claim 1, further including a UBM pad located on the surface adjacent to the corner and having approximately the same shape as the corner, the UBM pad including the UBM and at least one of an underlying metal layer and a conducting layer below the UBM, the UBM pad having an approximately triangular shape.

16. The MEMS device according to claim 15, wherein the MEMS device is a MEMS microphone, and the active part being a part of an active part of the MEMS microphone.

17. A MEMS device, comprising:
a surface having an under-bump metallization (UBM) to contact the MEMS device with a substrate via flip-chip bonding, the surface having a corner, the UBM having an approximate triangular shape; and
an active part on the surface and having a generally circular periphery;
wherein the UBM is located between the corner of the surface and the generally circular periphery of the active part, one corner point of the approximate triangular shape of the UBM being adjacent to the corner of the surface and one side edge of the approximate triangular shape of the UBM being adjacent to the generally circular periphery of the active part.

18. The MEMS device according to claim 17, wherein the MEMS device is a MEMS microphone chip and the active part includes a membrane.

19. The MEMS device according to claim 17, wherein the surface comprises four UBMs and four corners, one of the four UBMs is placed in a corresponding one of the four corners of the surface of the device, each of the four UBMs having an approximate triangular shape.

20. The MEMS device according to claim 17, wherein the UBM generally follows the shape of the corner of the surface and the shape of the active part.

21. The MEMS device according to claim 17, wherein the one side edge of UBM is curved.

22. The MEMS device according to claim 21, wherein the one side edge of UBM follows the shape of the active part at a constant distance from the active part.

* * * * *